(12) United States Patent
Axel

(10) Patent No.: US 7,468,644 B2
(45) Date of Patent: Dec. 23, 2008

(54) GRADIENT COIL ARRANGEMENT AND METHOD FOR USING THE SAME

(75) Inventor: Leon Axel, Philadelphia, PA (US)

(73) Assignee: New York University, New York, NY (US)

( * ) Notice: Subject to any disclaimer, the term of this patent is extended or adjusted under 35 U.S.C. 154(b) by 42 days.

(21) Appl. No.: 10/578,540

(22) PCT Filed: Nov. 5, 2004

(86) PCT No.: PCT/US2004/037054

§ 371 (c)(1), (2), (4) Date: May 4, 2006

(87) PCT Pub. No.: WO2005/045447

PCT Pub. Date: May 19, 2005

(65) Prior Publication Data

US 2007/0090906 A1    Apr. 26, 2007

(51) Int. Cl.
*H01P 7/00* (2006.01)
(52) U.S. Cl. ...................................... 333/219
(58) Field of Classification Search .................. None
See application file for complete search history.

(56) References Cited

U.S. PATENT DOCUMENTS

| | | | |
|---|---|---|---|
| 4,626,784 A * | 12/1986 | Sepponen | 324/309 |
| 4,755,755 A * | 7/1988 | Carlson | 324/319 |
| 5,736,858 A | 4/1998 | Katznelson et al. | |
| 6,493,572 B1 * | 12/2002 | Su et al. | 600/422 |
| 6,515,479 B1 | 2/2003 | Arz et al. | |
| 6,563,315 B1 * | 5/2003 | Boskamp et al. | 324/318 |
| 6,975,116 B2 | 12/2005 | McKinnon | |

OTHER PUBLICATIONS

Paul R. Harvey et al., "Modular Gradient Coil: A New Concept in High-Performance Whole-body Gradient Coil Design" Magnetic Resonance in Medicine, 1999, pp. 561-570.
Robert Turner, "Gradient Coil Design: A Review of Methods" Magnetic Resonance Imaging, vol. II, 1993, pp. 903-920.
R. Kimmlingen et al., "Gradient System Providing Continuously Variable Field Characteristics", Magnetic Resonance in Medicine 2002, pp. 800-808.

* cited by examiner

*Primary Examiner*—Benny Lee
*Assistant Examiner*—Kimberly E Glenn
(74) *Attorney, Agent, or Firm*—Dorsey & Whitney LLP

(57) ABSTRACT

A gradient coil arrangement generates magnetic field gradients across the main magnetic field of a magnetic resonance imaging system and includes a first conductive member, and a second conductive member electrically coupled to the first conductive member, wherein the second conductive member forms a segment that has an approximate shape of an arc when viewed along a direction of extension of the first conductive member.

42 Claims, 15 Drawing Sheets

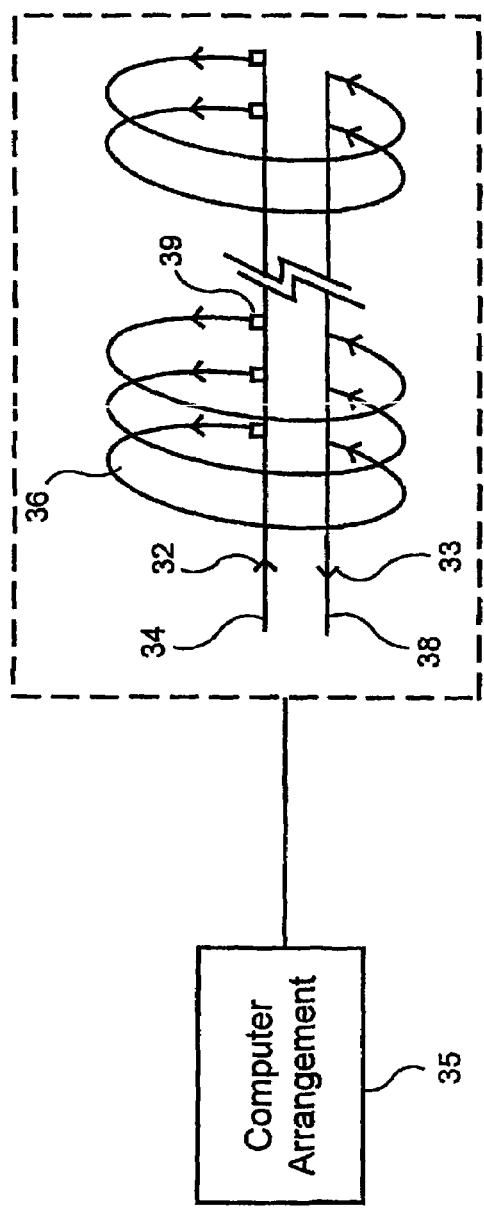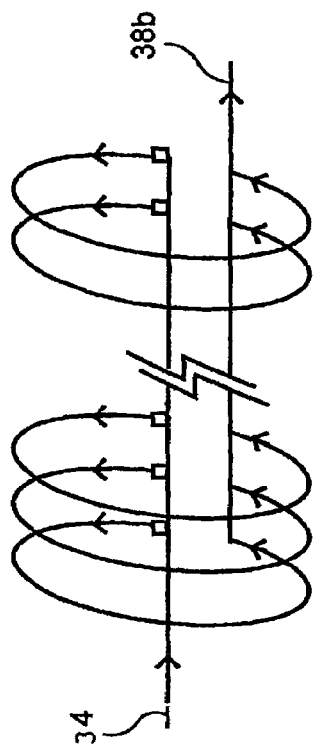
FIG. 3A
FIG. 3B

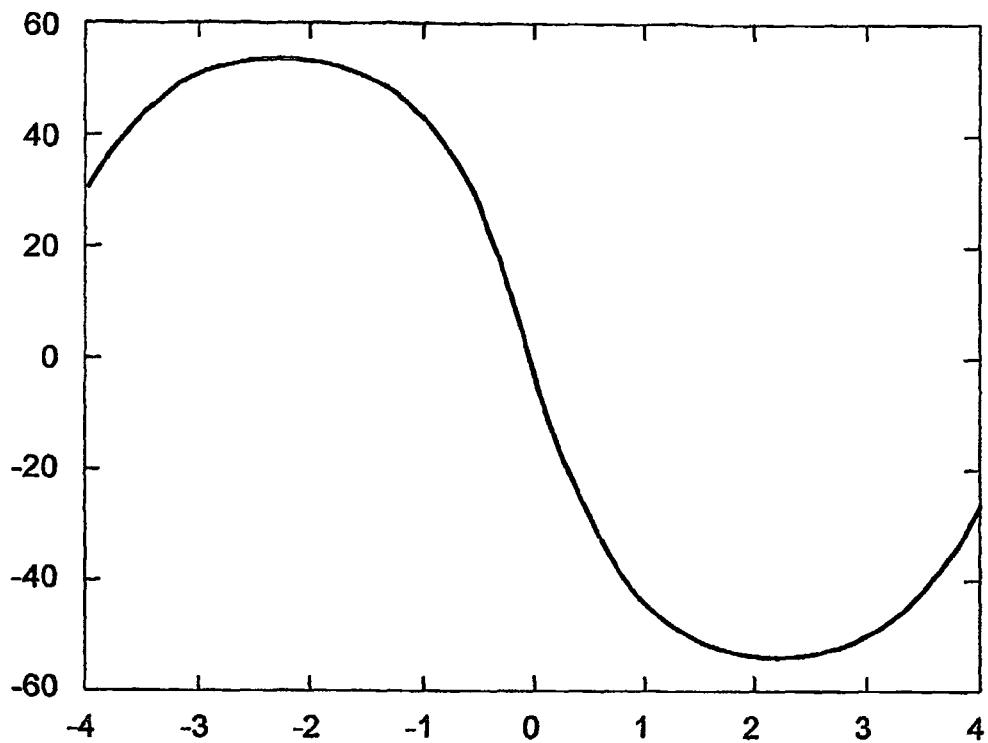
F I G. 5B
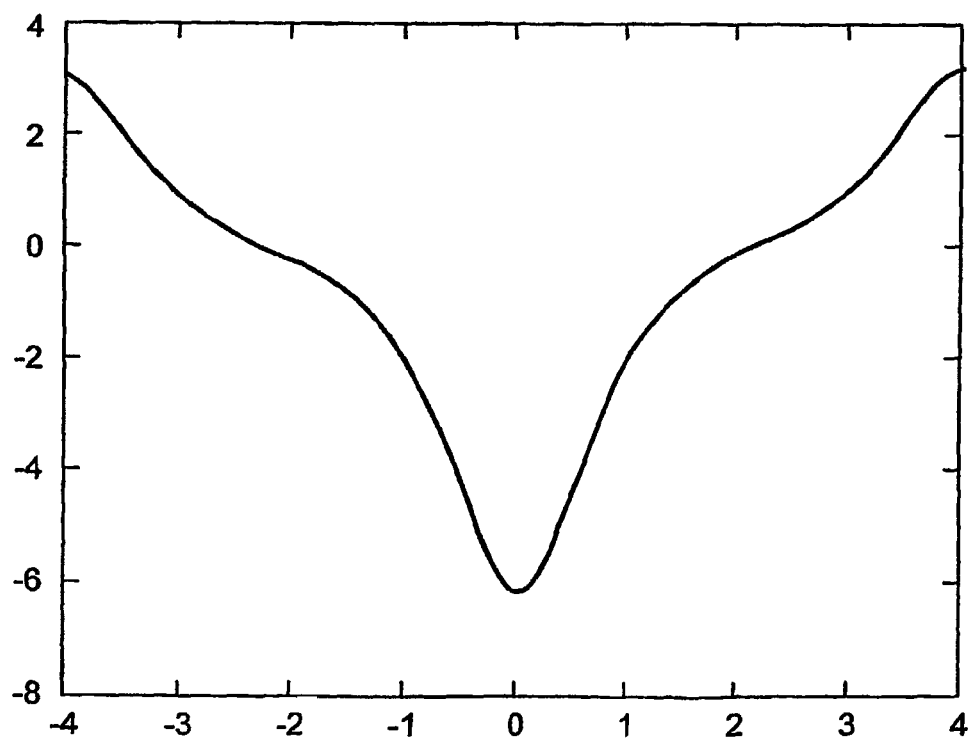
F I G. 5C

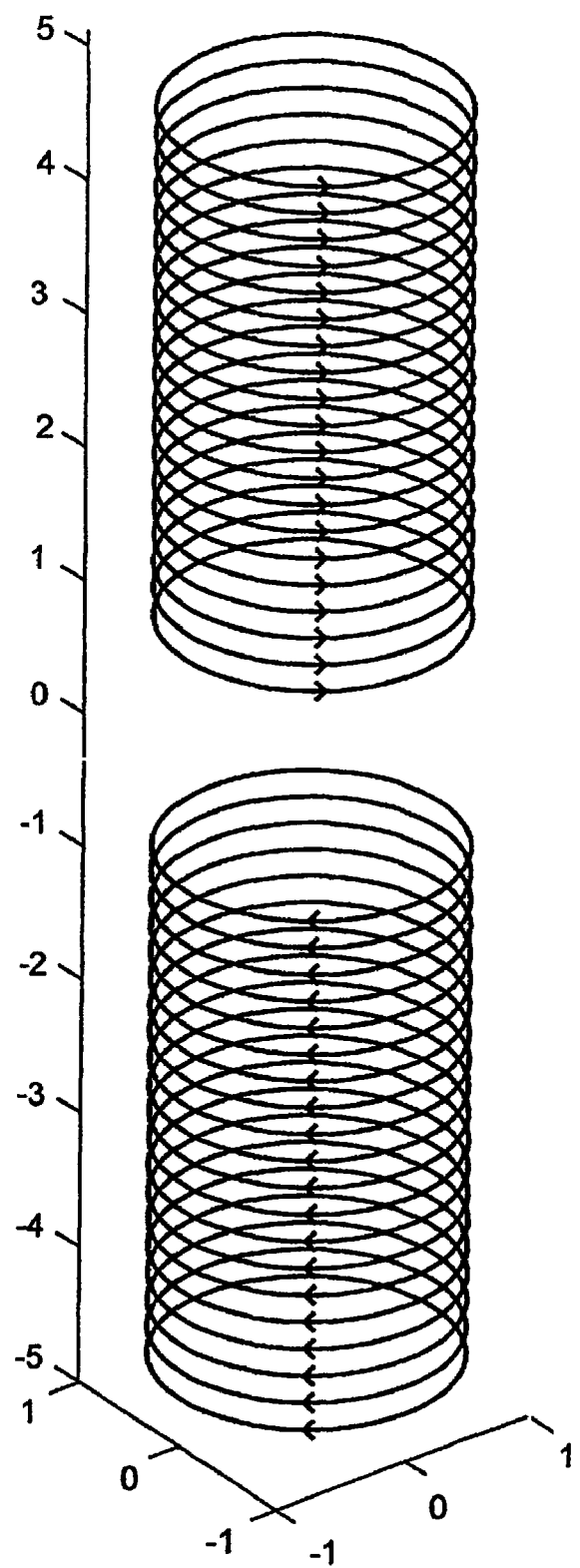
F I G. 7A

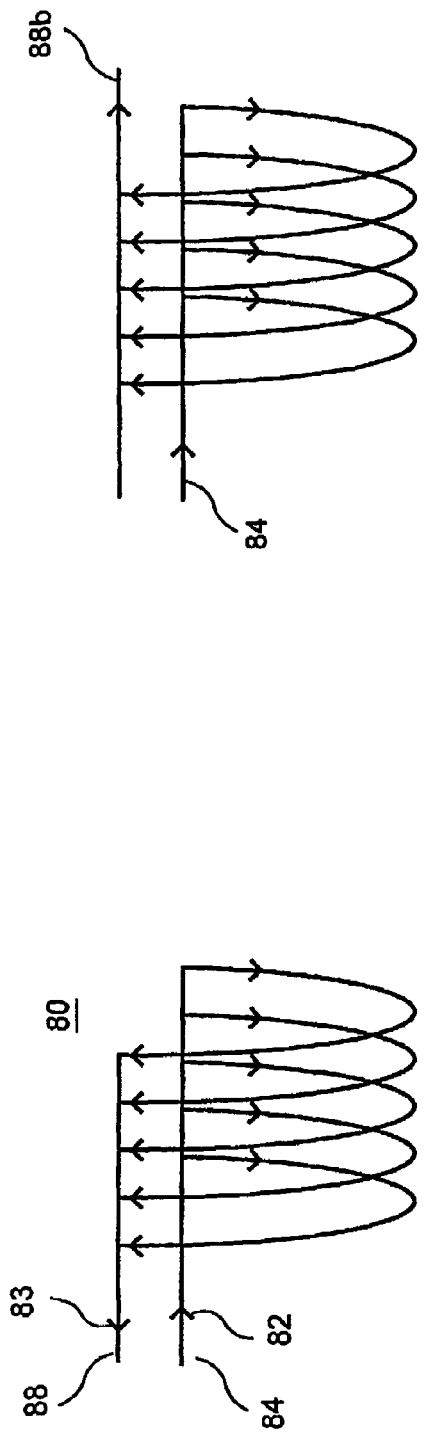
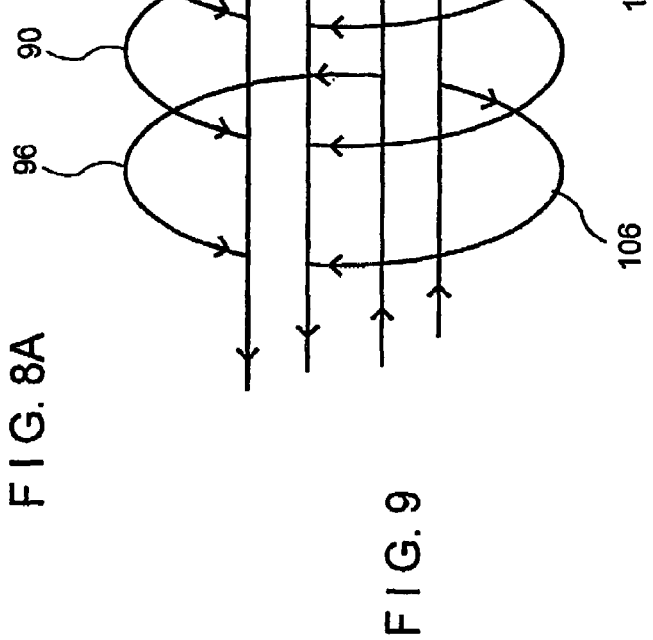

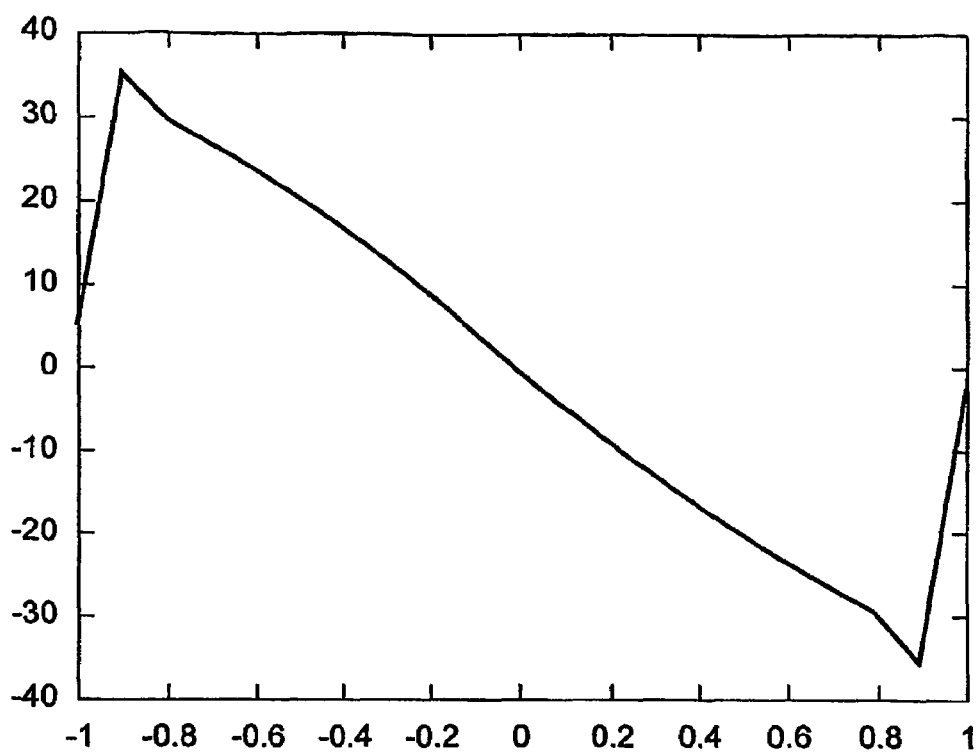
F I G. 10B
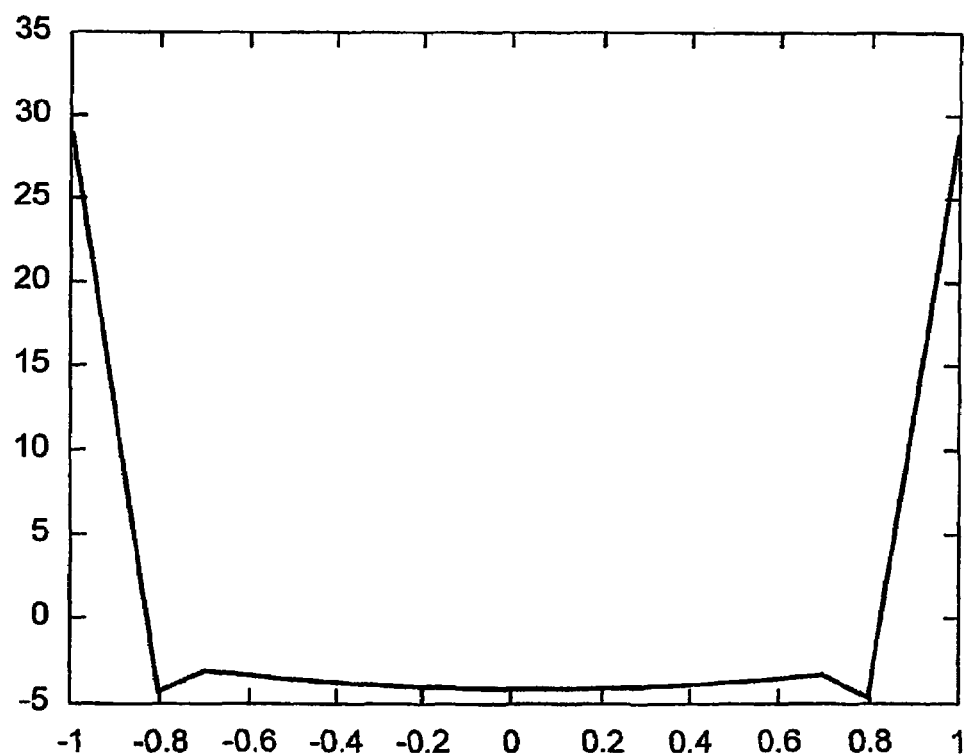
F I G. 10C

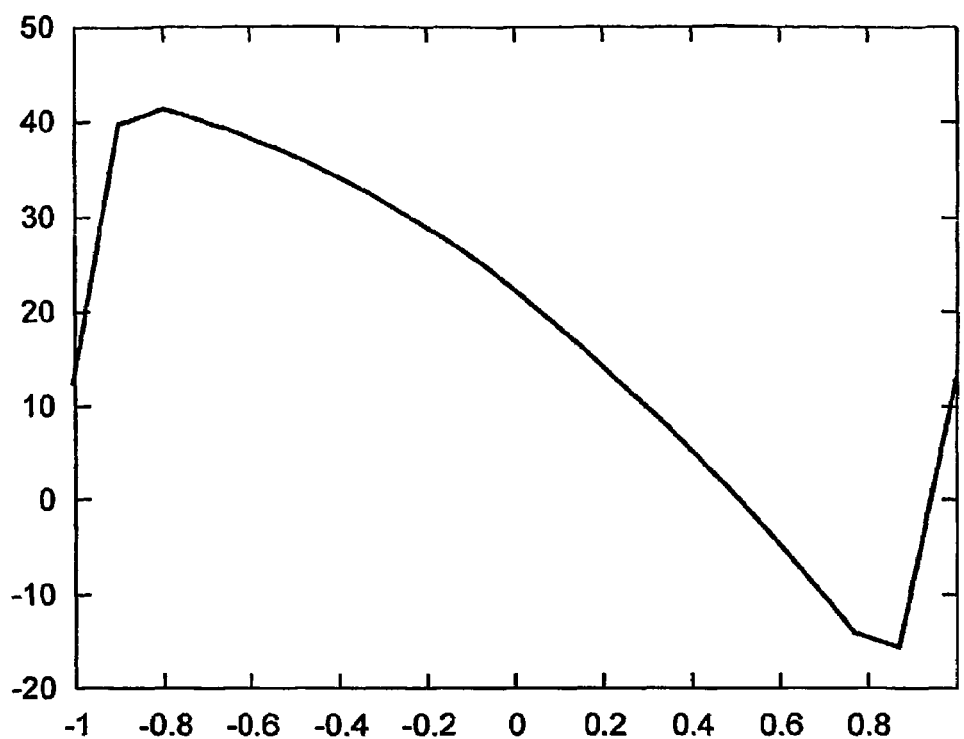
F I G. 13B
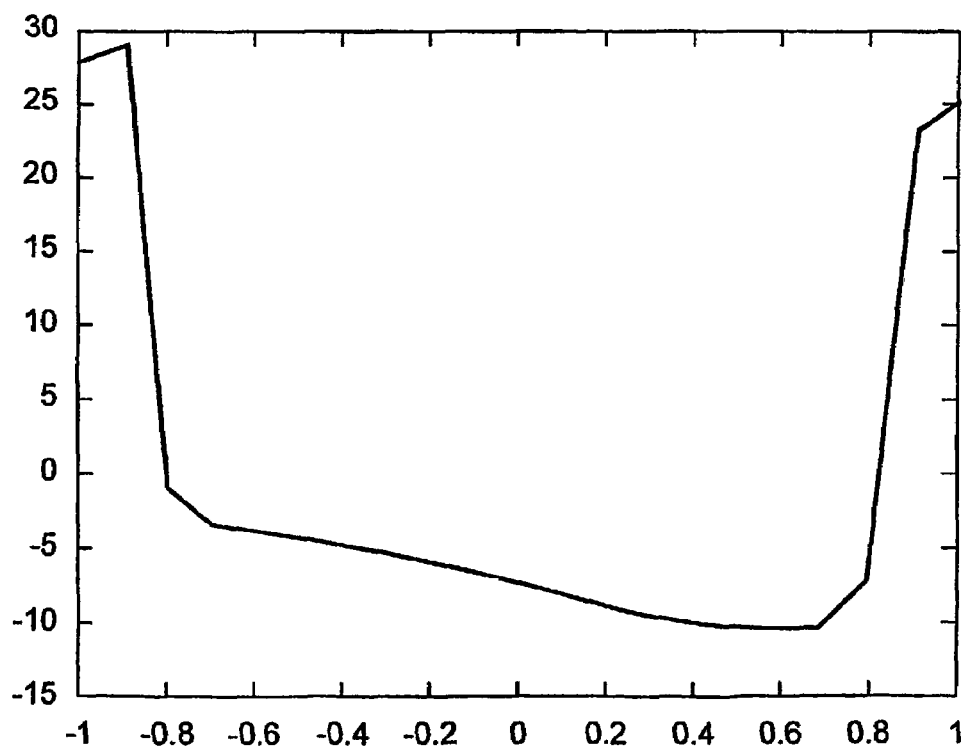
F I G. 13C

GRADIENT COIL ARRANGEMENT AND METHOD FOR USING THE SAME

FIELD OF THE INVENTION

This invention relates generally to magnetic resonance arrangement and method, and more particularly, to gradient coil arrangement for improving magnetic resonance imaging and to methods for providing such arrangements.

BACKGROUND INFORMATION

In a magnetic resonance imaging ("MRI") area, linear magnetic field gradients can be used for spatial encoding. Gradient coils are generally used to produce the linear magnetic field gradients. The gradient coils can be designed to provide an imaging field-of-view that may be fixed in size. In "whole-body" applications, the gradient coil may be designed to produce sufficiently linear or uniform magnetic field gradients over a volume that is larger than e.g., the volume for a dedicated cardiac scanner. As the useful volume is decreased, the stored energy of the gradient coil is generally reduced, which may allow for a higher system performance, and particularly, provide higher peak gradient strengths and faster gradient coil switching. Externally from the substantially linear region of the gradient field (and to a lesser extent within such region) the magnetic field gradients produce image distortion. Software-based distortion correction schemes have been developed to correct for non-uniformities within the useful volume, and to somewhat expand the useful imaging field of view beyond the linear region.

The gradient coils are heavy electromechanical devices, unlike most RF surface coils, which can be easily removed and replaced with different RF coils between imaging procedures. A gradient coil, due to its high power nature and the high forces created when it is energized, is generally firmly fixed within an MRI system. As such, a dedicated gradient coil tends to make the MRI system a special-purpose imaging system, thus limiting its scope and use for clinical application. Thus, a given geometry gradient coil may result in a corresponding field of view.

MRI systems and methods use the magnetic field strength dependence of the frequency of magnetic resonance, in conjunction with computer-controlled magnetic field gradients, to produce images based on the magnetic resonance signal. The mapping of position into frequency through the gradient can be used for a reconstruction of the image from signals that are detected in the presence of the gradients or after the gradients have been applied (e.g., using "frequency" or "phase" encoding, respectively). In addition, the excitation of the magnetic resonance in the presence of the gradient can be used for a selective excitation of a "slice" or "slab" to be imaged. Other uses of the gradients in MRI systems and methods include a suppression of unwanted signals by "spoiling" excited resonance and a sensitization of the signal to particular aspects of motion, such as a bulk velocity or a diffusion.

Although conventional magnetic resonance imaging systems include magnetic field gradient-generating coils, such coils are generally designed to have very uniform magnetic field gradients (i.e., a very linear field variation with position) over a relatively large volume of the imaging system magnet bore. These coils allow for a flexibility of choice of structures to be imaged with faithful reproduction of the subject's geometry; however, there are some disadvantages associated therewith.

First, the practically achievable strength of the gradient field is limited because of the high power demands that are generally used to fill a large region with a uniform gradient. Thus the achievable image resolution and the ability to use strong gradients for other purposes, such as measuring diffusion, are limited.

Second, the achievable gradient switching speeds are also limited, because of power limitations (which are greater for a larger region of uniform gradient) and because of the physiologic limits on the allowable local rate of change of the magnetic field (which are more restrictive for larger regions of uniform magnetic field gradient). Thus the imaging speed and the ability to use the rapidly switched gradients for other purposes (such as measuring short T2 relaxation times) are limited.

Third, if a large subject is imaged with uniform gradients, a large amount of imaging data should be used to acquire a correspondingly large amount of the imaging data to reconstruct the image without artifacts in a given region of interest. This is due to aliasing of remote structures, particularly with phase encoding, even if the images of much of the rest of the region being reconstructed are not within the area of interest. If it is previously known that only a relatively restricted portion of the subject's volume is the area of interest, then the image acquisition speed can be increased because the need to cover a large region with a uniform magnetic field gradient may be removed.

In the past, attempts have been made to address these deficiencies. For example, an overview of gradient coil design was described in: Turner R., "Gradient coil design: a review of methods," Magnetic Resonance Imaging 11: 903-920; 1993, which is incorporated herein by reference in its entirety. As described in this publication, localized gradient coils can be used for an increased resolution imaging of superficial or relatively localized structures. However, these conventional approaches have generally employed the concept of constructing a smaller gradient coil to be used inside the bore of an MRI system, with a relatively uniform gradient field in the vicinity of the coil to be used for localized imaging. Other methods have been previously described to correct for the geometric distortion that is introduced by gradient nonlinearity, which are generally available on most manufacturer's MRI systems. However, these methods currently have not been used in conjunction with the gradients designed to have fields with specific controlled nonlinearity, as addressed in further detail below in accordance with the present invention. Certain manufacturers have developed MRI systems with two sets of gradient coils mounted in the bore of the magnet, i.e., a longer conventional coil and a shorter concentric coil for higher performance imaging of shorter regions: such system is described in Harvey P R, Katznelson E., "Modular Gradient Coil: a New Concept in High-Performance Whole-Body Gradient Coil Design," Magnetic Resonance in Medicine 42:561-570; 1999, which is incorporated herein by reference in its entirety. However, these systems are not designed to take the full advantage of the possibilities offered by reducing the need for high gradient uniformity in the imaging region. This is because the effective geometries of such coils are not electrically adjustable, as compared to the arrangement according to the present invention, other than offering the possibility of switching between using either of the coils separately or together.

SUMMARY OF THE INVENTION

One of the objects of the present invention is to overcome the aforementioned problems and deficiencies. For example, an exemplary embodiment of the present invention can improve the local MRI by imaging a restricted or predefined portion of the subject, when such imaging is desired. By using this embodiment, the continual need to use gradients that are uniform over large regions of the subject is reduced or even eliminated. Thus, the exemplary embodiment also overcomes several disadvantages, as are mentioned above, when gradients are designed to be uniform over large regions. When the requirement of a creation of large regions of the gradient uniformity for imaging is removed, the imaging speed can be significantly improved (e.g., due both to more rapid switching of the gradients achievable and to less problems due to aliasing), and the imaging resolution may be improved (e.g., due to higher strength gradients achievable in the more restricted region being imaged). Other benefits of the more rapidly switched and stronger localized gradients can also be realized, such as a better diffusion weighting to study diffusion, and a more effective homogeneity spoiling to suppress an unwanted magnetization excitation. The cost of the improved performance may include additional image processing so as to remove distortion, but that can be readily and rapidly carried out.

According to another exemplary embodiment of the present invention, MRI may be performed using the gradient coils that may be designed to produce a strong gradient e.g., only over a relatively restricted region, (e.g., a "ZOnally OptiMized" ZOOM™ gradient coil). The use of such coils may result in a distorted image when implemented with conventional image reconstruction methods to obtain a good resolution, e.g., only in the region of the strong gradient. However, if the portion of the subject which it is desired to image can be positioned within this region, the distortion of further remote regions would likely not pose a practical problem for the image interpretation. Furthermore, since the spatial distribution of the gradient strength is previously known (e.g., can be determined by the geometry of the coil), and thus the resulting image distortion of the further remote regions is known, the images can be corrected for this distortion, and the correct image geometry can be recovered even if the effective local spatial resolution is still non-uniform. The nominal plane of the image may be distorted due to the nonuniformity of the gradient in conjunction with a selective excitation. For a three-dimensional image reconstruction of a slab excitation, the prior knowledge of the gradient configuration can be used to effectively re-sample the reconstructed region into corrected images using flat planes. Due to the fact that a gradient field that is strong only over a restricted region requires less power to generate, and can be switched more rapidly, images may be acquired more rapidly or with a higher resolution than would otherwise be achievable using conventional highly uniform gradient coils.

Another potential benefit according to the present invention is an effective compression of the region to be reconstructed, which can be produced when using the non-uniform imaging gradient, to reduce the amount of imaging data preferable to be acquired without the potential risk of aliasing: such compression can result in a further decrease of imaging time. Thus, the gradient coil can be used with relatively limited regions of gradient uniformity (e.g., the linear variation of the axial component of the magnetic field) so as to produce a locally-stronger gradient strength than could be achieved with conventional coils, which may be designed to have large regions of gradient uniformity when used in MRI. These coils can be used in conjunction with tailored image processing techniques which are designed to correct for the resulting distortions in image geometry, while retaining the potential for locally greater image resolution.

According to yet another embodiment of the present invention, a gradient coil may be provided for a production of a strong magnetic field gradient along the axis of an MRI system, which can include two "solenoidal-type" coils with oppositely directed current flows (and corresponding oppositely directed local longitudinal magnetic fields), coaxially arranged and axially offset with a short gap therebetween. The coil arrangement may,be in a form of either with a helical conductor arrangement or with an arrangement of approximately circular arcs of the conductor, as described herein below.

According to still another exemplary embodiment of the present invention, a gradient coil can be provided for a generation of a magnetic field gradient that is transverse to the axis of the MRI system, such gradient coil can include at least two sets of approximately parallel arcs with oppositely directed current flows, which can effectively act as a split longitudinally solenoidal coil, with oppositely directed currents in the two fractions. For the arc sets with equal angular extent, this exemplary design of the coil can provide a very homogeneous transverse gradient field across the width of the MRI system, which may have advantages over the conventional transverse gradient coil designs. For the arc sets with unequal angular extent, the gradient is likely stronger in the region between the sets, with the potential advantages for an improved performance of local imaging in such region, particularly when viewing the subject area radially off the nominal Z-axis of the MRI machine (i.e., in the X and/or Y direction).

According to a further exemplary embodiment of the present invention, a method and arrangement for adjusting the effective geometry of the current-carrying components of a gradient coil using electrically switchable conducting elements are provided. Such arrangement may permit the adjustment of the characteristics of the locally optimized gradient field. Such arrangement may also permit the use of the same physical coil, in either a conventional mode (with a large homogeneous gradient region) or in the locally concentrated gradient mode as described above.

BRIEF DESCRIPTION OF THE DRAWINGS

FIG. 3A shows an isometric view of a third exemplary embodiment of the coil arrangement according to the present invention.

FIG. 3B shows an isometric view of a fourth exemplary embodiment of the coil arrangement according to the present invention.

FIG. 5B shows a graph of the magnetic field in an magnetic resonance imaging (MRI) machine along the z axis of a simulation of FIG. 5A.

FIG. 5C shows a graph of the z gradient along the z axis, produced by the simulation of FIG. 5A.

FIG. 7A shows a simulation generated by the MATLAB software associated with the coil arrangements of FIG. 6A.

FIG. 8A shows an isometric view of a ninth exemplary embodiment of the coil arrangement according to the present invention.

FIG. 8B shows an isometric view of an tenth exemplary embodiment of the coil arrangement according to the present invention.

FIG. 9 shows an isometric view of a eleventh exemplary embodiment of the coil arrangement according to the present invention.

FIG. 10B shows a graph of the magnetic field in the MRI machine across the axis, of the simulation of FIG. 10A.

FIG. 10C shows a graph of the x gradient along the x axis, produced by the simulation of FIG. 10A.

FIG. 13B shows a graph of the magnetic field in the MRI machine across the axis, of the simulation of FIG. 13A.

FIG. 13C shows a graph of the x gradient along the x axis, produced by the simulation of FIG. 13A.

Figure 2A:
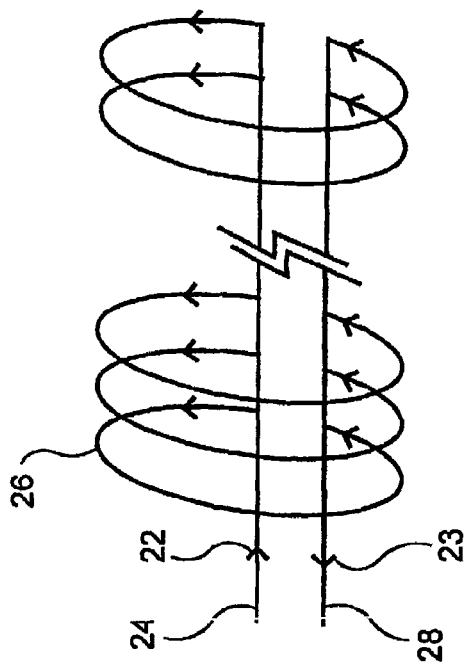
FIG. 2A shows an isometric view of a first exemplary embodiment of a coil arrangement according to the present invention.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION OF THE PREFERRED EMBODIMENTS

Conventional cylindrical MRI systems typically utilize two different kinds of gradient coils: one designed to produce a gradient along the axis of the magnet (i.e., along the nominal "z" direction—"longitudinal"), and another designed to produce a gradient perpendicular to the axis (i.e., along the nominal "x" and/or "y" direction—"transverse"). Combining suitable gradient fields along the x, y, and/or z directions can produce a resultant gradient along any desired combined resultant direction, which can correspondingly be used to produce an image in any desired orientation. It may be convenient to construct gradient coils designed with restricted linear regions, as described herein, to similarly produce primary gradient directions along the nominal x, y, and/or z directions of the MRI system.

Although conventional gradient coils are generally designed to produce large regions of a homogeneous gradient (i.e., a very linear variation of magnetic field with position along a particular direction over a large region), different coil arrangements may generate more restricted regions of the homogeneous gradient (i.e., magnetic fields that vary strongly with respect to position only over a more restricted region). These coil arrangements can vary for coils designed to produce gradients along the axis of the magnet and gradients that are perpendicular to the axis.

Figure 1:
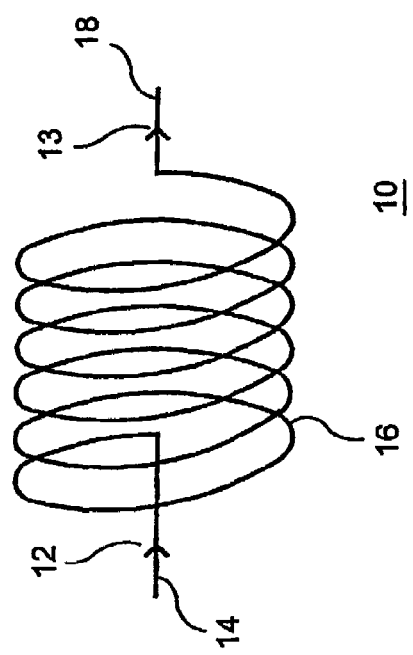
FIG. 1 shows an isometric view of a conventional solenoid coil.

FIG. 1 depicts a conventional solenoid coil 10. In operation, current enters the coil 10 in one end 14 in the direction of an arrow 12, passes through turns 16 of the coil, and exits the coil 10 at an opposite end 18 in the direction of another arrow 13. Such solenoid coil 10 can produce a uniform magnetic field directed along the axis of the cylinder, with a relatively rapid decrease in strength past the ends of the cylinder.

Described below are exemplary embodiments of the present invention illustrated in FIGS. 2A to 7 which may have certain relevance to longitudinal gradient coils.

Figure 2B:
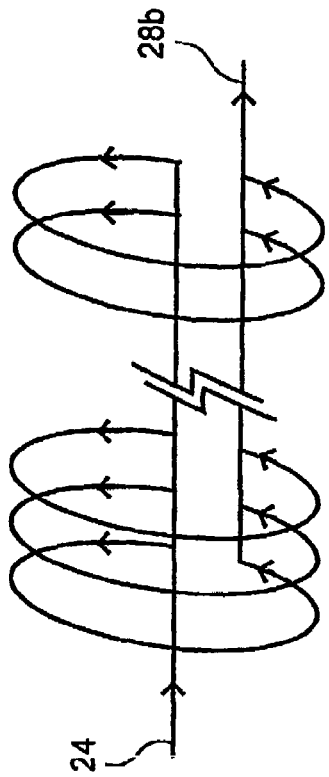
FIG. 2B shows an isometric view of a second exemplary embodiment of the coil arrangement of the present invention.

In particular, FIG. 2A depicts a first exemplary embodiment of a coil arrangement according to the present invention. Current may enter a first section 24 of the coil arrangement 20 in the direction of an arrow 22, may pass through turns 26 of the coil, and may exit a second section 28 of the coil arrangement 20 in the direction of an arrow 23. Each turn 26 of the coil arrangement 20 is provided in parallel with the turn on either side thereof, rather than being arranged in series as provided in the conventional arrangement illustrated in FIG. 1. In a second exemplary embodiment of the coil arrangement according to the present invention as shown in FIG. 2B, the second section 28b may be located on a side of the coil arrangement that is opposite to the first section 24.

Because each turn 26 of the coil arrangement 20 is arranged in parallel, for certain applications it may be desirable to monitor the relative resistance of parallel circuit branches. In order to control the resulting field distribution, it may be desirable to ensure that the current traversing each path is the same. One exemplary method for monitoring the relative currents in each conducting path is to provide each such path with a small pickup coil (not shown herein). If an alternating-current test signal is injected into the main circuit, the resulting alternating voltage induced in each pickup coil may be proportional to the current (and inversely proportional to the net resistance) in the corresponding path being monitored. If the geometry of each such pickup coil is properly adjusted, equal currents may result in equal monitoring signals. Furthermore, any difference detected in the monitor signals may be used to adjust any trim resistors which can be provided (not shown herein) in each path in order to make the net resistances (and thus the net currents) in each path at least approximately equal. The manner of monitoring and the manner of equalizing the current may be applicable to all exemplary embodiments of the present invention.

FIG. 3A depicts a third exemplary embodiment of a coil arrangement 30 according to the present invention. Current may enter a first section 34 of the coil arrangement 30 in the direction of an arrow 32. The current may then pass through switches 39, which may be located between the first section 34 and a turn 36. The switches may be turned "on" thus allowing current to pass through them, or may be turned "off," so that current is prevented from passing through them. Neighboring switches may be in different states, and this may allow a user (using a computer 35 or other suitable arrangement) to control the effective length and spacing of the turns of the coil arrangement 30. If a particular switch 39 is turned "on," current may then pass through the turn 36 of the coil arrangement 30 associated with the switch 39, and may exit a second section 38 of the coil arrangement in the direction of the arrow 33. According to a fourth exemplary embodiment of the coil arrangement shown in FIG. 3B, the second section 38 may be located on the side of the coil arrangement 30 that is opposite to the first section 34. A computer arrangement 35 is shown here in FIG. 3A but may be applicable in all figures.

Figure 4B:
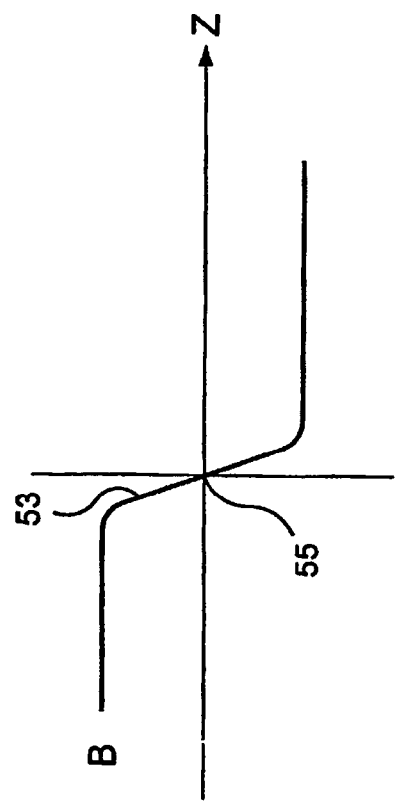
FIG. 4B shows a graph illustrating a magnetic field associated with the coil arrangement of FIG. 4A.
Figure 4A:
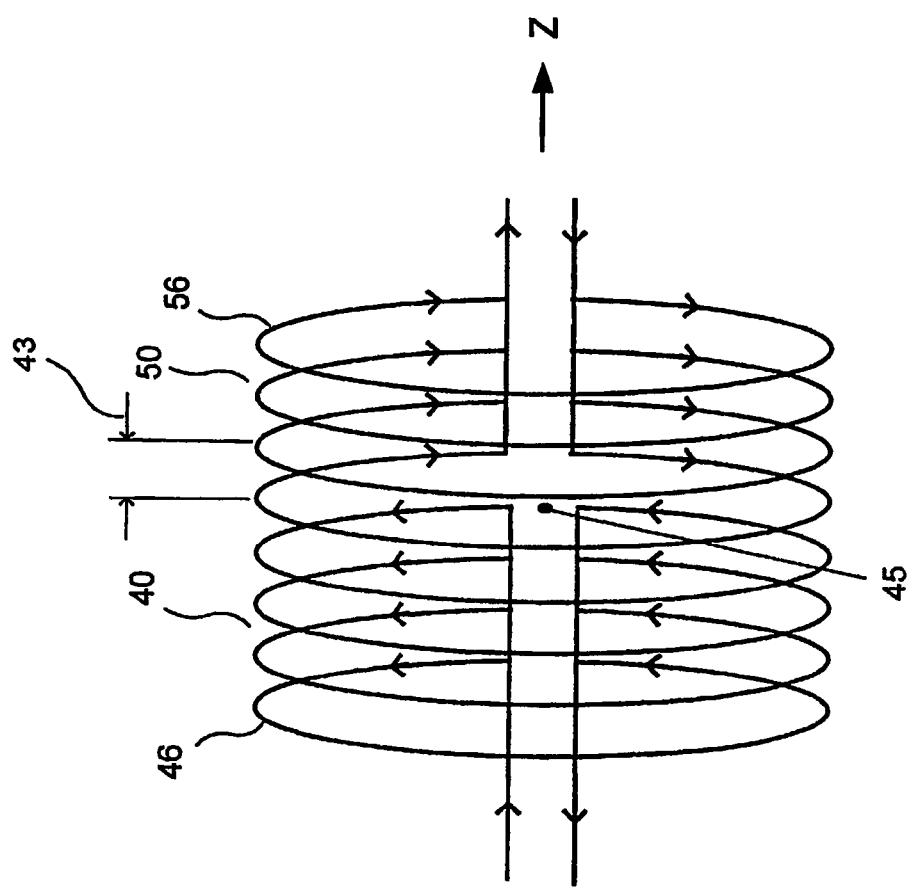
FIG. 4A shows an isometric view of a fifth exemplary embodiment of the coil arrangement according to the present invention.

FIG. 4A depicts a fifth exemplary embodiment of a coil arrangement according to the present invention. Two coils 40, 50 of this arrangement may be placed in an end-to-end configuration with opposite polarity (e.g., the direction of current that passes through turns 46 of the first coil 40 is opposite to the direction of current that passes through turns 56 of the second coil 50).

A relatively localized region of varying field strength along the axis can be produced by constructing a composite longitudinal coil using the coil arrangement of FIG. 4A. The generation of this field may result in a strong local field gradient in the longitudinal direction, without high fields being provided at a distance. Thus, two coils provided on a common axis (e.g., aligned with the axis of the MRI system's magnet), with current flowing in opposite directions around them (positioned so that their ends are relatively close together), can produce such result. Within a bore of each separate component of the coil arrangement, there may be produced an approximately uniform (and oppositely directed) local magnetic field. In the region of the junction between the coils 40, 50, the field strength may vary rapidly with respect to a position along the axis thereof. However, the variation may be linear only in the center of this region. The illustration of such field strength is depicted in FIG. 4B. In particular, a point 45 of FIG. 4A at least approximately corresponds to an area 55 of the graph of FIG. 4B. Thus, the shorter the distance 43 that the innermost activated turns of each coil are together, the greater the slope of the transition area 53 of the Z direction of the magnetic field shown in FIG. 4B.

Figure 5A:
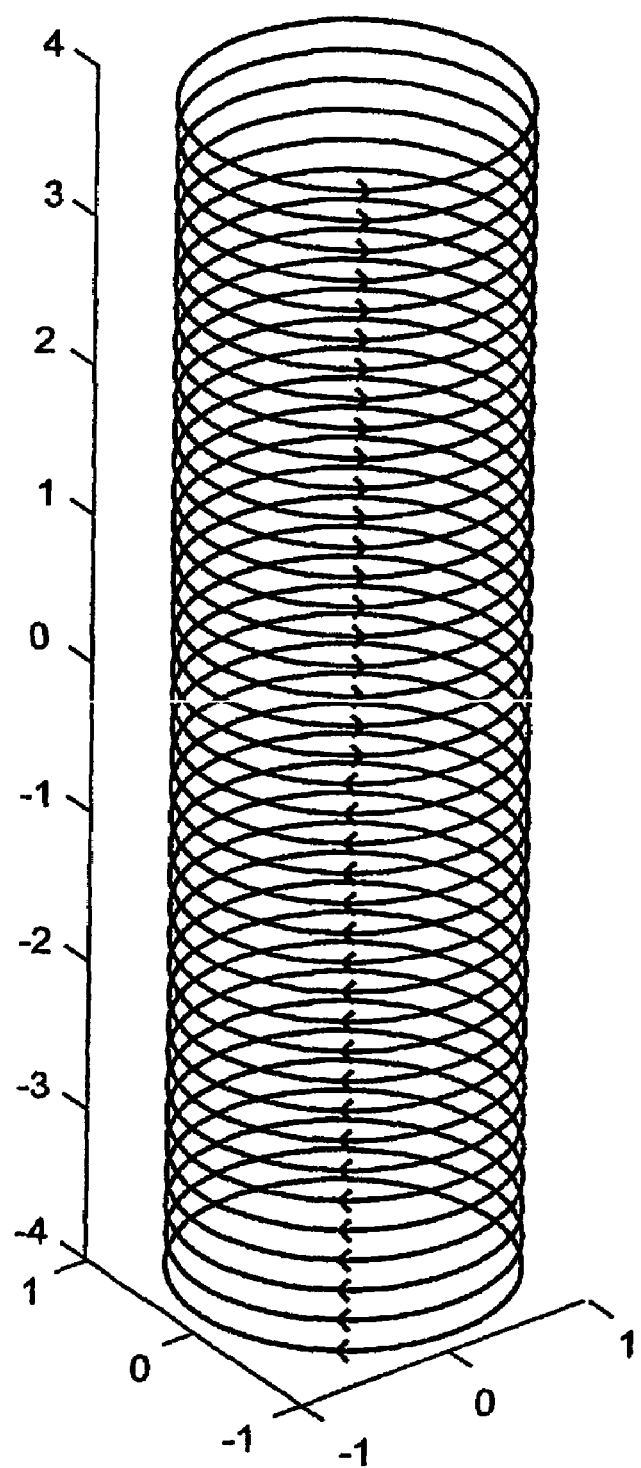
FIG. 5A shows a simulation generated by MATLAB software associated with the coil arrangement of FIG. 4A.

When the magnetic field of the gradient coil is superimposed on a larger magnetic field of the imaging magnet, the result is a corresponding gradient of the magnetic field along the axis that is provided in a nominal z direction, centered in the region of the junction between the component coils 40, 50. FIG. 5A shows a simulation (created using a MATLAB product of the potential implementation) of the exemplary coil arrangement of FIG. 4A, illustrated with a gap 43 of 0.2. FIG. 5B depicts the magnetic field along the z axis of the coil arrangement shown in FIG. 5A. Arrows depict the direction of the current flowing. The separation of the two coil elements 40, 50 can be varied to control the strength of the gradient and the effective length of its region in space. The spacing of the windings of the conductors on the surface of the coil arrangement can be varied to assist in the control of the profile of the gradient field. The movement of the patient support table along the axis of the MRI system can be used to position a portion of the subject that is desired to be imaged within the region of the strong gradient.

FIG. 5C depicts an exemplary z gradient along the z axis produced by the coil arrangement shown in FIG. 5A. Modified arrangements which include conventional solenoid coil, can also include localized gradient coil arrangements. According to a sixth exemplary embodiment of the present invention (not shown herein), two conventional solenoid coils provided on a common axis (with current flowing in opposite direction) can produce similar results to those shown in FIGS. 5B and 5C.

Figure 6B:
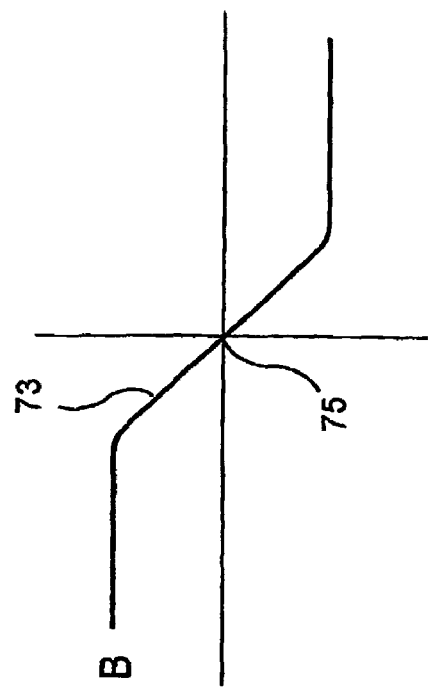
FIG. 6B shows a graph illustrating the magnetic field associated with the coil arrangement of FIG. 6A.
Figure 6A:
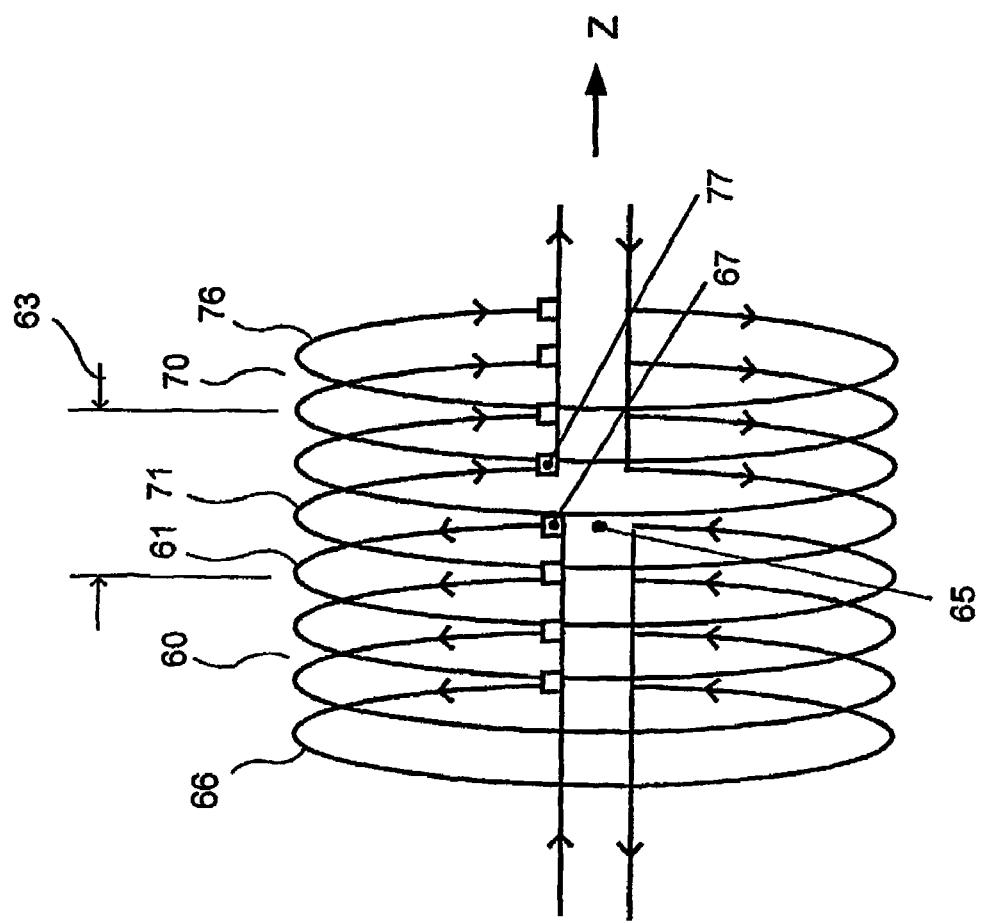
FIG. 6A shows an isometric view of a seventh exemplary embodiment of the coil arrangement according to the present invention.

FIG. 6A depicts a seventh exemplary embodiment of the coil arrangement according to the present invention. Two coils 60, 70 may be placed in an end-to-end configuration with an opposite polarity. This means that the direction of the current passing through turns 66 of a first coil 60 is opposite the direction of current passing through turns 76 of a second coil 70. The turns 66, 76 of both coils may have corresponding switches 69, which may either permit or prevent current from passing there through. Neighboring switches may be provided in different states, and thus allowing a user (using a computer or another suitable arrangement) to control an effective distance 63 between the innermost activated turns, the quantity of turns of activated coils, and/or the effective length of the coils. In FIG. 6A, inner turn 61 of the first coil/solenoid 60 and inner turn 71 of the second coil/solenoid 70 are shown as not being activated, and thus in this exemplary embodiment, the current does not pass therethrough because switches 67 and 77 are shown as being open. This arrangement may effectively produce a larger gap between the coils 60, 70.

In the region of the junction between the coils 60, 70, the field strength may vary rapidly with position along the axis, although the variation may be approximately linear only in the center of this region, as shown in FIG. 6B. A point 65 in FIG. 6A corresponds to an area 75 of the graph of FIG. 6B. The greater the distance 63 that the most inner activated turns of each coil are together, the lower the slope of the transition area 73 of the Z direction magnetic field shown in FIG. 6B.

Figure 6C:
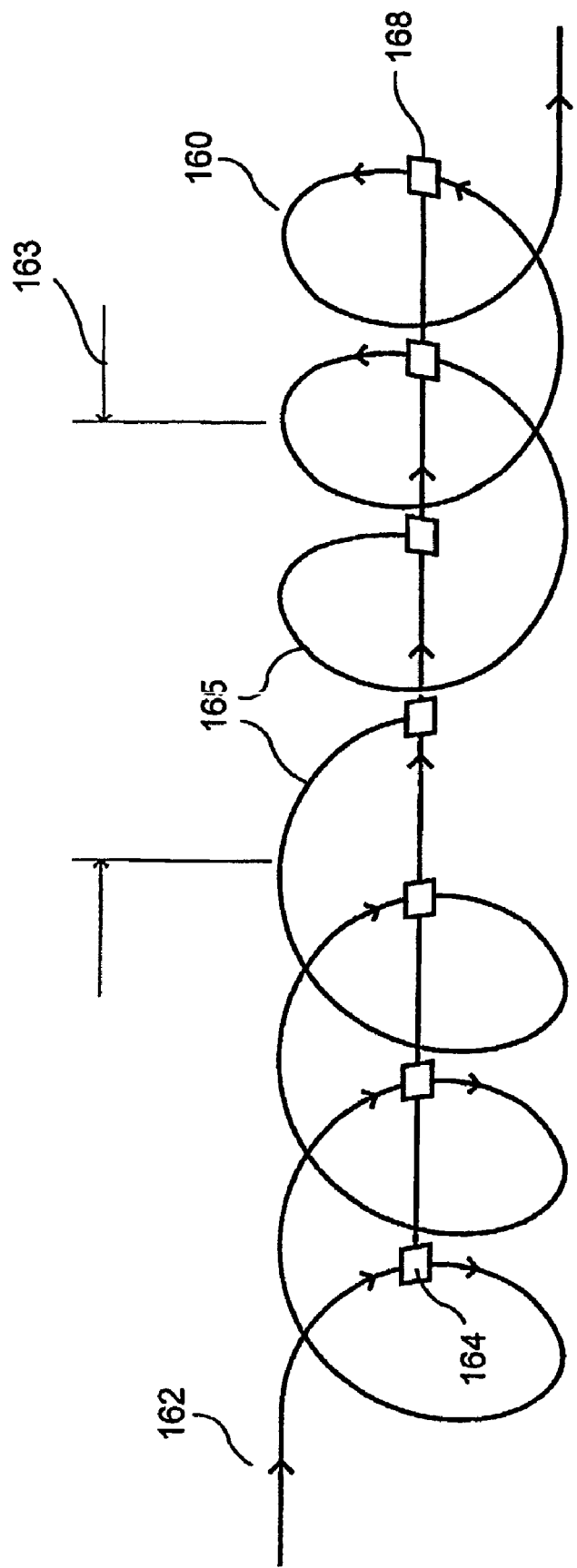
FIG. 6C shows an isometric view of an eighth exemplary embodiment of the coil arrangement according to the present invention.

FIG. 6C depicts an eighth exemplary embodiment of the coil arrangement according to the present invention which uses a conventional solenoid coil with switches 168 located so as to either permit or prevent current from passing there through. The arrows 162 depict the current flowing through the coil arrangement. Internal elements 164 of the switches 168 are shown schematically in FIG. 6C to illustrate how the current may pass through the windings of the coil arrangement. In this figure, the inner windings 165 are shown as being not activated, and thus the results in the effective offset 163 as shown therein. Thus, a conventional solenoid coil, with the addition of appropriately placed switches, can be used to dynamically control the effective offset and produce the magnetic field of the embodiment shown in FIG. 6A.

Figure 7B:
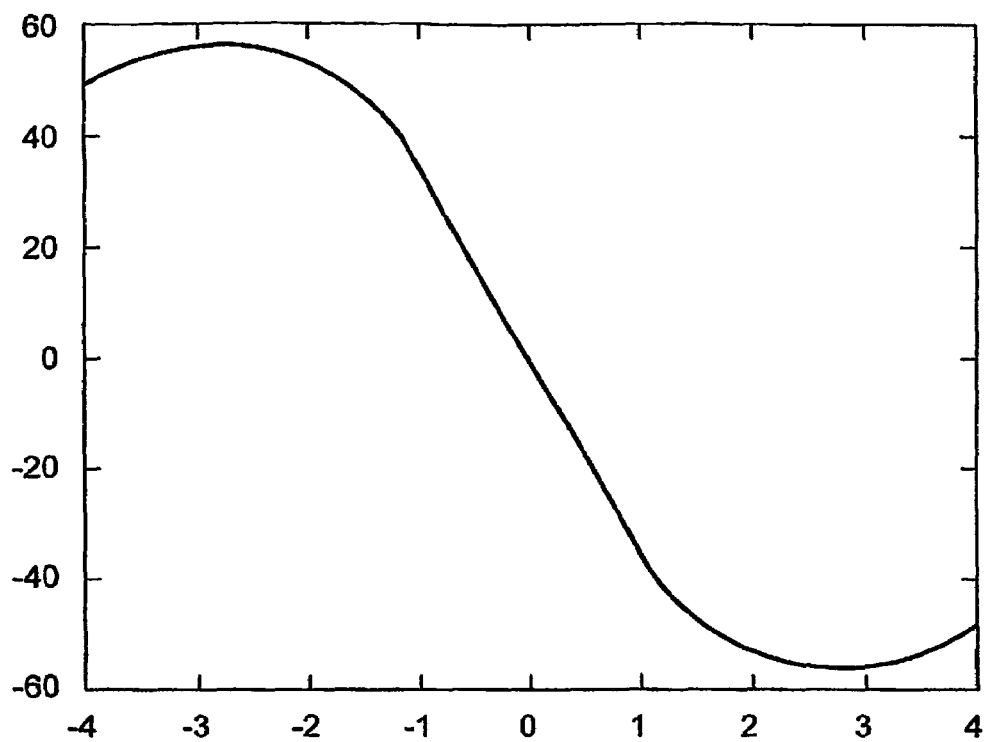
FIG. 7B shows a graph of the magnetic field in the MRI machine along the z axis of the simulation of FIG. 7A.
Figure 7C:
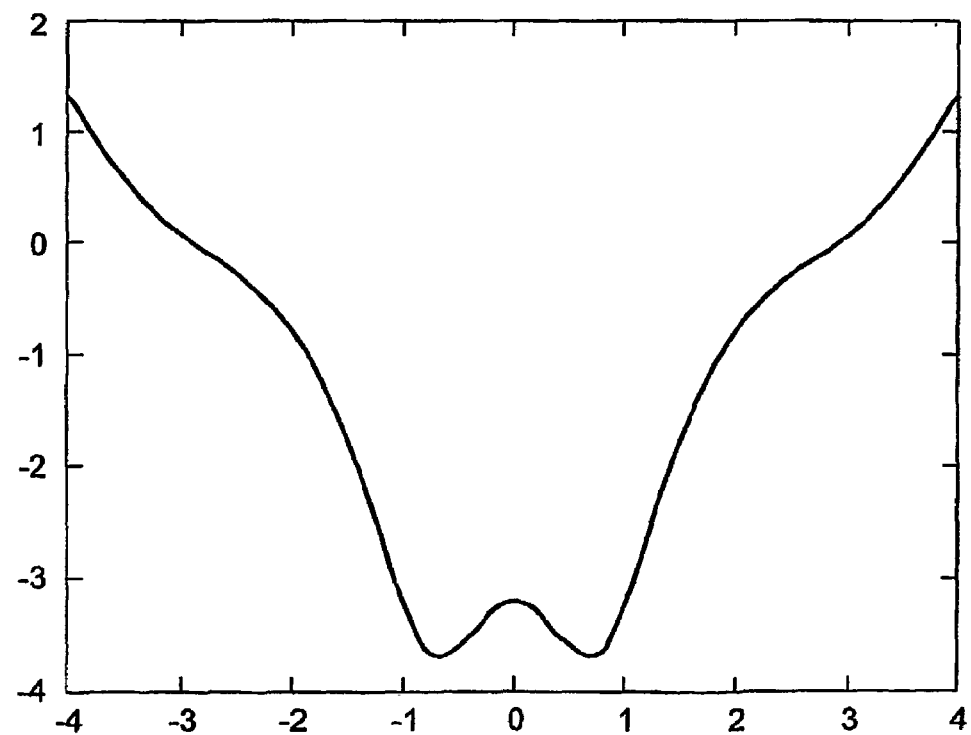
FIG. 7C shows a graph of the z gradient along the z axis, produced by the simulation of FIG. 7A.

Exemplary simulations of the implementations of the coil arrangements according to the present invention are shown in FIGS. 7A, 7B, and 7C. FIG. 7A is a simulation created in MATLAB of the embodiment of FIG. 6A, with a gap (63 in FIG. 6A) of 1.7. Arrows depict the direction of the current flowing. In particular FIG. 7B depicts the magnetic field along the z axis of the exemplary coil arrangement of FIG. 7A. FIG. 7C depicts the z gradient along the z axis, produced by the exemplary coil arrangement of FIG. 7A.

FIGS. 8A to 13 show other exemplary coil arrangements which have particular relevance to transverse gradient coils.

In particular FIG. 8A depicts an ninth exemplary embodiment of the coil arrangement 30 according to the present invention. Current may enter a first section 84 of a coil segment 80 in the direction of an arrow 82, pass through turns 86 of the coil arrangement 80, and may exit at a second section 88 of the coil arrangement 80 in the direction of an arrow 83. In a tenth embodiment of the coil arrangement shown in FIG. 8B, the second section 88b may be located on the side of the coil arrangement opposite to the first section 84. The coil segment of the coil arrangement shown is approximately semicircular, but other angles (e.g., 40 degrees, 80 degrees, 110 degrees, 230 degrees, etc.) are conceivable and within the scope of the present invention.

FIG. 9 depicts a eleventh exemplary embodiment of the coil arrangement according to the present invention. Two coil segments 90, 100 may be placed adjacent to one another with an opposite polarity, i.e., the direction of current passing through turns 96 of a first coil segment 90 is opposite the direction of current passing through turns 106 of a second coil segment 100. Such configuration may result in the generation of transverse gradients that are uniform throughout the lengths of the coil segments of the coil arrangement. The longitudinal gradient (in the Z direction) can be approximately zero for this coil arrangement. If the coil segments are of equal arc length, uniform transverse gradients may be created across the width of the turns 96, 106 of the coil segments.

Figure 10A:
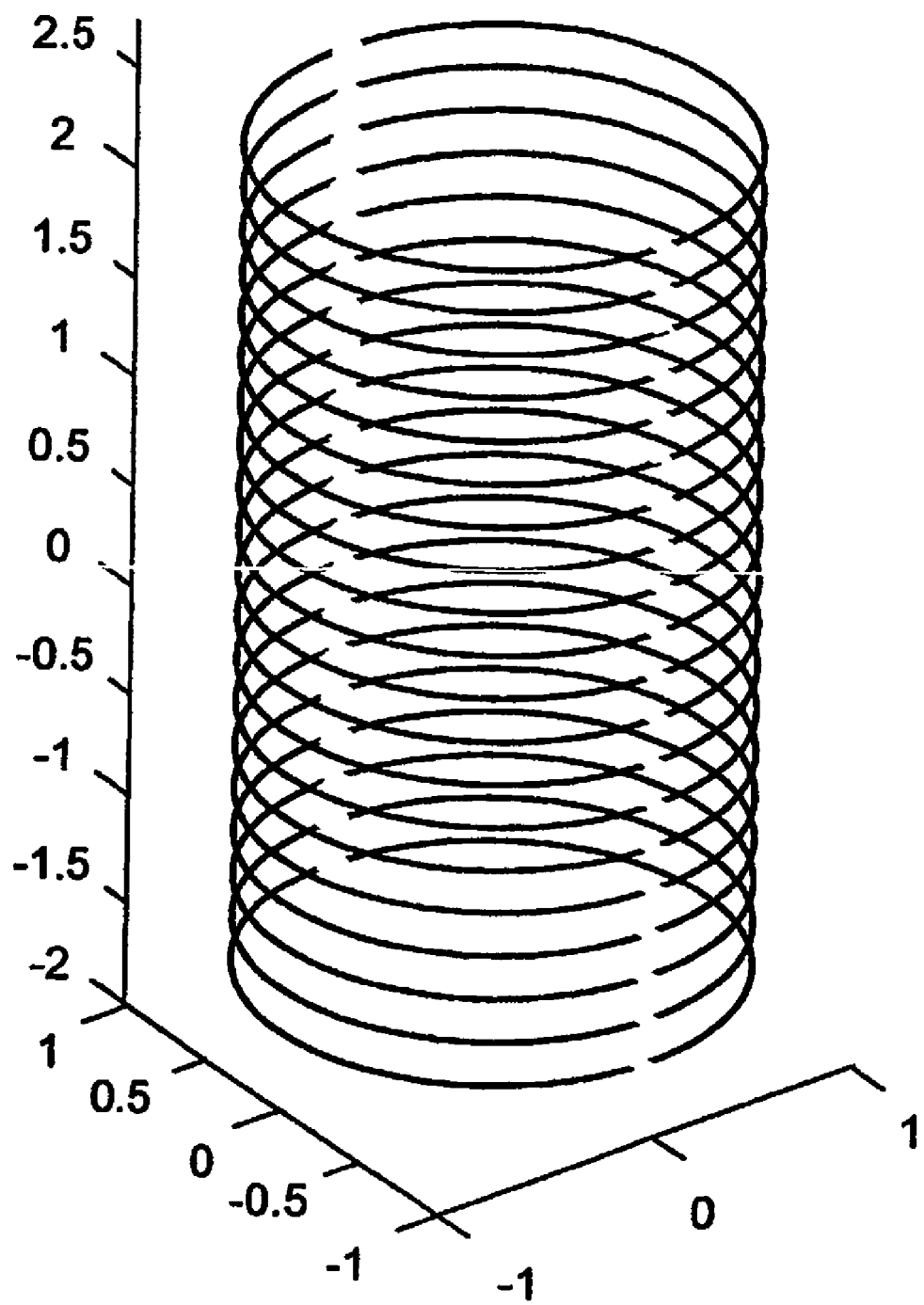
FIG. 10A shows a simulation generated by the MATLAB software associated with the coil arrangement of FIG. 9.

Exemplary simulations of the implementations of the coil arrangement according to the present invention are shown in FIGS. 10A, 10B, and 10C. FIG. 10A is a simulation created in MATLAB of the embodiment of FIG. 9, with symmetric arcs. In particular, FIG. 10B depicts the magnetic field across the axis of the exemplary arrangement of FIG. 10A. FIG. 10C depicts the x gradient along the x axis, produced by the exemplary arrangement of FIG. 10A.

Figure 11:
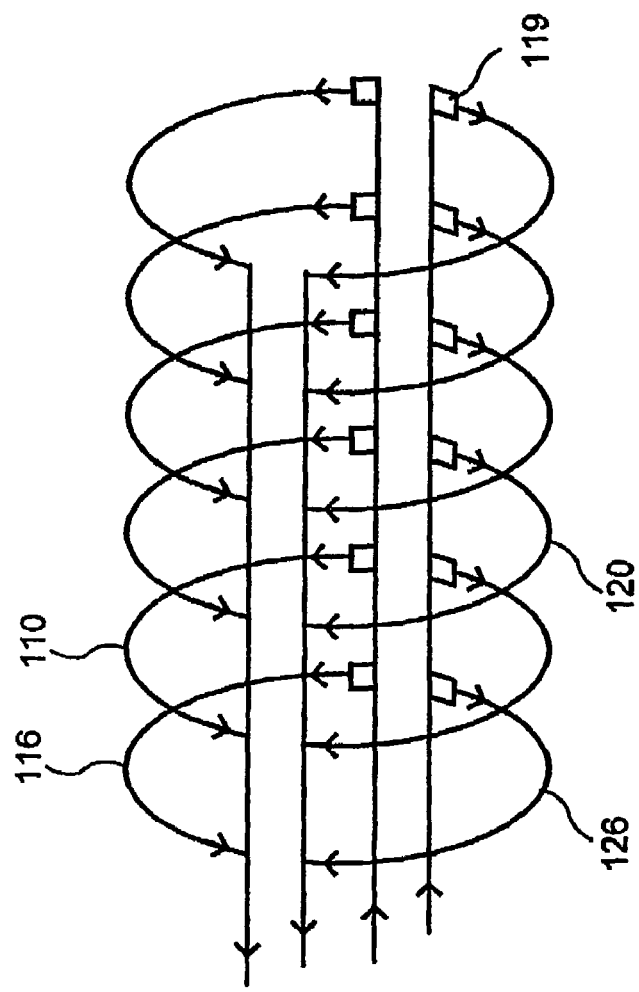
FIG. 11 shows an isometric view of an twelfth exemplary embodiment of the coil arrangement according to the present invention.

FIG. 11 depicts an twelfth exemplary embodiment of the coil arrangement according to the present invention. Two coil segments 110, 120 may be placed adjacent to one another with an opposite polarity i.e., the direction of current passing through turns 116 of a first coil segment 110 is opposite the direction of current passing through turns 126 of a second coil segment 120. The turns 116, 126 of both coils may have corresponding switches 119, which may either permit or prevent current from passing therethrough. Neighboring switches may be provided in different states, and thus allowing a user (through a computer or another suitable arrangement) to control a quantity of turns of activated coils and/or an effective length of the coils. Thus, using different terminology, cylindrical coil formers with ladder-like current-carrying segments of conductors, including approximately circular arcs connected by approximately longitudinal segments, arranged on their surface, can achieve this result.

Close to the mid section of the area within each such cylinder segment, the magnetic field may be fairly uniform and may be oriented along the axis depending on the direction of the flow of current. If a composite coil is constructed from close apposition of two such cylindrical segments on opposite sides of the axis (with current flowing in opposite directions in the segments), the superimposition of the fields may result in a generation of a transverse gradient of the magnetic field in the region between the segments. When the current-carrying arcs of the coils are of similar angular extent, the resulting gradient field can be approximately uniform across the bore of the coil, which may be a desirable feature according to the present invention, e.g., to be incorporated into conventional MRI systems (see FIGS. 10B and 10C). Alternatively, if one set of arcs is larger (in an angular extent) than another set of arcs, a more localized (and likely locally stronger) gradient may be produced, possibly strongest in the region of the gap between the two coil element sets (see e.g., FIGS. 13B and 13C, and the description hereafter). Using asymmetric arc segment coil sets may be useful for viewing areas that are radially offset from the z-axis of the MRI machine.

While the longitudinal motion of the patient support table of the imaging system can be used to position the subject within a "sweet spot" of the more localized longitudinal axial gradient coils, the physical size of the subject may prevent a transverse displacement of the subject to be positioned within the corresponding "sweet spot" of the transverse gradient coils. Accordingly, coils can be constructed with multiple connecting segments of conductors that can be electrically switched open or closed. In this manner, the effective size and location of the separate coil components can be varied. The location of the junction between two opposite magnetic fields can thus be correspondingly shifted to match the region to be imaged. Similarly, the longitudinal gradient coil set can be constructed with switchable conducting elements so as to permit for the adjustment of the effective relative gap between the two coil element sets, and thus allow for the adjustment of the strength of the gradient and of the length of its effective region. Thus, by using one physical gradient coil set, it is possible to electrically reconfigure such coil set to act either as a conventional gradient coil (with a large region of uniform gradient strength) or as a ZOOM™ coil (with a restricted region of higher gradient strength). In this manner, it may be possible to avoid the previous preference to physically exchange gradient coils when it is desired to change from conventional MRI to "zoomed" MRI.

Figure 12:
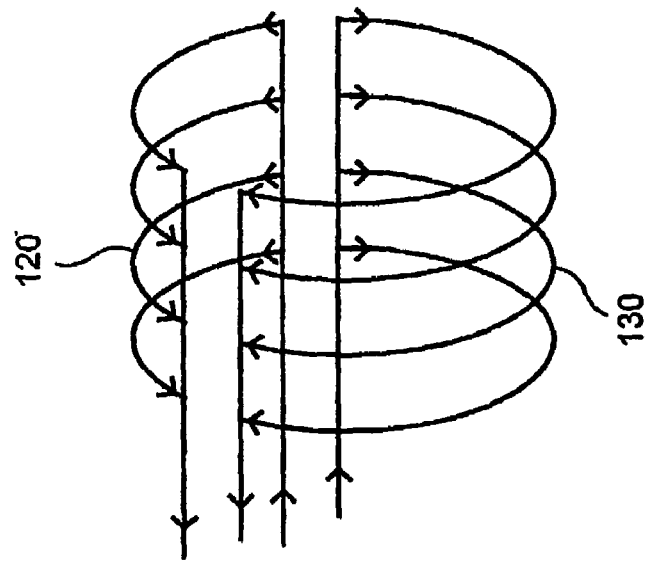
FIG. 12 shows an isometric view of a thirteenth exemplary embodiment of the coil arrangement according to the present invention.

FIG. 12 depicts a thirteenth exemplary embodiment of the coil arrangement according to the present invention which uses asymmetric coil segments of approximately 108 degrees and 252 degrees. Thus, a first coil segment 120 is of smaller angular extent than the second coil segment 130 of the coil arrangement.

Figure 13A:
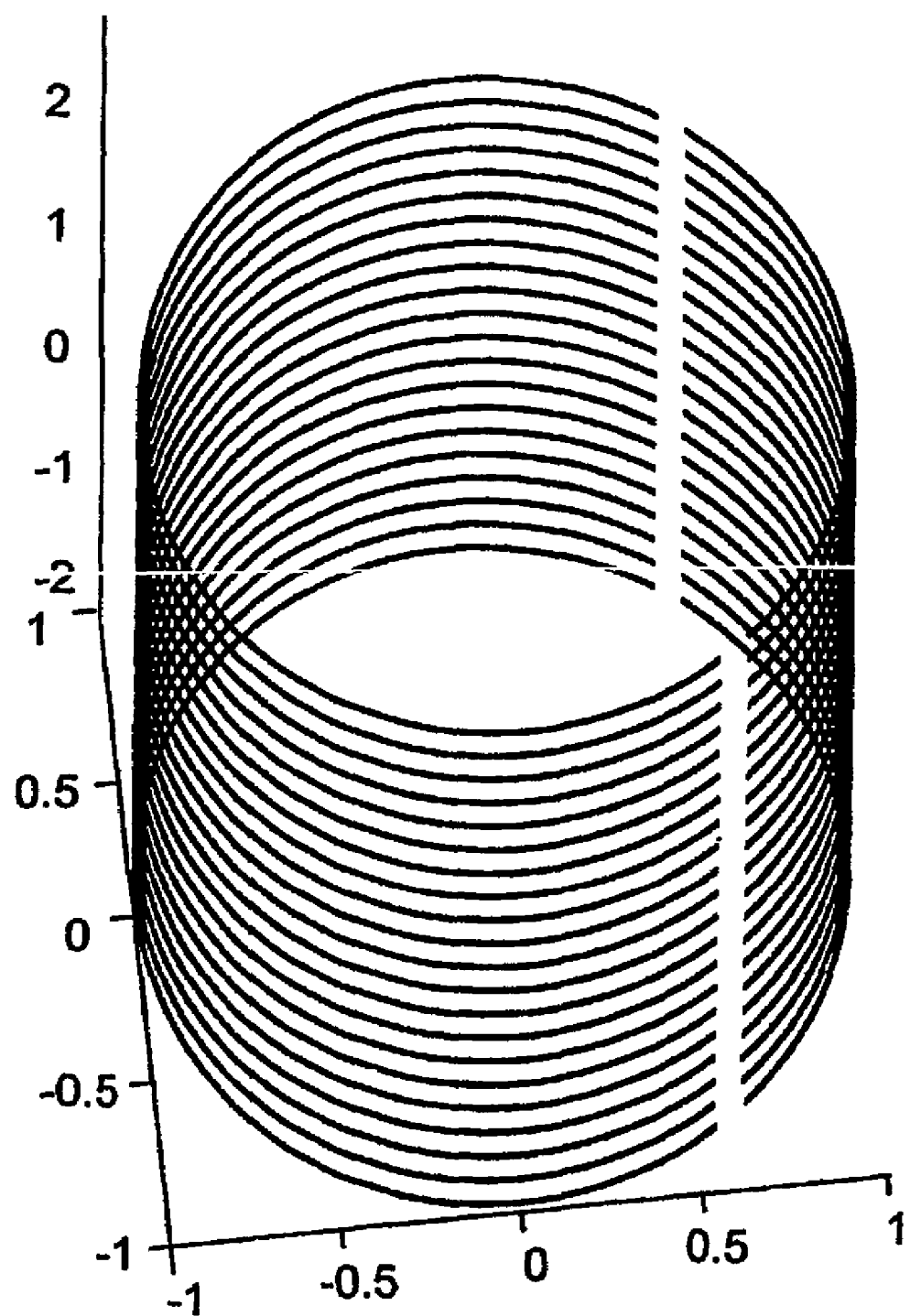
FIG. 13A shows a simulation generated by the MATLAB software associated with the coil arrangement of FIG. 12, with asymmetric arcs.

Exemplary simulations are shown in FIGS. 13A, 13B and 13C. FIG. 13A shows an exemplary simulation generated using MATLAB software performed on the coil arrangement of FIG. 12, with asymmetric arc segments. FIG. 13B depicts the magnetic field across the axis associated with the simulation of FIG. 13A. FIG. 13C depicts the x gradient along the x axis produced by the simulation of FIG. 13A.

The aforementioned exemplary coil arrangements may be constructed with additional elements surrounding them so as to minimize the electromagnetic interaction with external structures to further improve performance.

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention. For example, 3 or more coil arc segments of various angular extents may be used along with suitable switching and control to construct a transverse gradient coil arrangement according to the present invention. Further, the present invention is not limited to imaging magnetic field gradients, and has other applications, such as spectroscopy.

I claim:

1. A coil arrangement comprising:
a first conductive member arranged along a first axis; and
a second conductive member arranged along a second axis which is approximately coaxial with the first axis,
wherein the first conductive member is adapted to allow a first current to flow in a first direction, and the second conductive member is adapted to allow a second current to flow in a second direction which is opposite to the first direction,
wherein the first and second conductive members form at least one magnetic field gradient coil structure, and
wherein the first conductive member is offset axially from the second conductive member.

2. A computer-readable medium for operating a magnetic resonance imaging system comprising a coil arrangement of claim 1, the computer-readable medium having a set of instructions operable to direct a processor to perform the steps of: permitting the first conductive member to receive an electrical current; permitting the second conductive member to pass the electrical current therethrough; permitting the electrical current to exit through the third conductive member; and permitting a plurality of switches to dynamically control the offset between the second conductive member and a fourth conductive member, wherein the fourth conductive member is electrically coupled to the first conductive member and the third conductive member.

3. A coil arrangement comprising:
a first conductive member arranged along a first axis;
a second conductive member arranged along a second axis which is approximately coaxial with the first axis; and
a switch configured to dynamically control an offset between the first and the second conductive members,
wherein the first conductive member is offset axially from the second conductive member, and
wherein the first conductive member is adapted to allow a first current to flow in a first direction, and the second conductive member is adapted to allow a second current to flow in a second direction which is opposite to the first direction.

4. The coil arrangement of claim 3, further comprising:
at least one further switch configured to dynamically control the offset between the first and the second conductive members.

5. The coil arrangement of claim 4, wherein the switch allows the first current to flow through the first conductive member, and the at least one further switch prevents current from flowing through the second conductive member.

6. The coil arrangement of claim 4, wherein the switch and the at least one further switch are configured to control at least one of a modifiable length of the coil arrangement or a distance between the first and second conductive members.

7. A computer-readable medium for operating a magnetic resonance imaging system comprising a coil arrangement of claim 3, the computer-readable medium having a set of instructions operable to direct a processor to perform the steps of:
permitting the first conductive member to receive an electrical current;
permitting the second conductive member to pass the electrical current therethrough;
permitting the electrical current to exit through the third conductive member; and
facilitating a plurality of switches to dynamically control an offset between the second conductive member and a fourth conductive member,
wherein the fourth conductive member is electrically coupled to the first conductive member and the third conductive member, and
wherein the plurality of switches is configured to control at least one of a modifiable length of the coil arrangement or a distance between the second and the fourth conductive members.

8. A magnetic resonance imaging system-comprising a coil arrangement comprising:
a first conductive member arranged along a first axis; and
a second conductive member arranged along a second axis which is approximately coaxial with the first axis,
wherein the first conductive member is adapted to allow a first current to flow in a first direction, and the second conductive member is adapted to allow a second current to flow in a second direction which is opposite to the first direction,
wherein the first and second conductive members form at least one magnetic field gradient coil structure, and
wherein the first conductive member is offset axially from the second conductive member.

9. A magnetic resonance imaging system comprising a coil arrangement comprising:
a first conductive member arranged along a first axis;
a second conductive member arranged along a second axis which is approximately coaxial with the first axis; and
a switch configured to dynamically control an offset between the first and the second conductive members,
wherein the first conductive member is offset axially from the second conductive member, and
wherein the first conductive member is adapted to allow a first current to flow in a first direction, and the second conductive member is adapted to allow a second current to flow in a second direction which is opposite to the first direction.

10. A method of providing a coil arrangement comprising:
providing a first conductive member arranged along a first axis; and
providing a second conductive member arranged along a second axis which is approximately coaxial with the first axis,
wherein the first conductive member is adapted to allow a first current to flow in a first direction, and the second conductive member is adapted to allow a second current to flow in a second direction which is opposite to the first direction,
wherein the first and second conductive members form at least one magnetic field gradient coil arrangement, and
wherein the first conductive member is offset axially from the second conductive member.

11. A method for providing a coil arrangement comprising:
providing a first conductive member arranged along a first axis;
providing a second conductive member arranged along a second axis which is approximately coaxial with the first axis; and
dynamically controlling an offset between the first and the second conductive members,
wherein the first conductive member is offset axially from the second conductive member, and
wherein the first conductive member is adapted to allow a first current to flow in a first direction, and the second conductive member is adapted to allow a second current to flow in a second direction which is opposite to the first direction.

12. A computer-readable medium for operating a magnetic resonance imaging system comprising a coil arrangement comprising a first conductive member arranged along a first axis and a second conductive member arranged along a second axis which is approximately coaxial with the first axis, the computer-readable medium having a set of instructions operable to direct a processor to perform the steps of:
permitting a first current to flow in a first direction in the first conductive member; and
permitting a second current to flow in a second direction in the second conductive member, the second direction being opposite to the first direction,
wherein the first and second conductive members form at least one magnetic field gradient coil structure, and
wherein the first conductive member is offset axially from the second conductive member.

13. The computer-readable medium of claim 12, wherein the set of instructions further having the steps of:
facilitating a plurality of switches to dynamically control an offset between the first and the second conductive members.

14. The computer-readable medium of claim 12, wherein the set of instructions further having the steps of:

facilitating a plurality of switches to dynamically control an offset between the first and the second conductive members, wherein the plurality of switches is configured to control at least one of a modifiable length of the coil arrangement or a distance between the second and the fourth second conductive members.

15. A coil arrangement comprising,
a first conductive member;
a second conductive member electrically coupled to the first conductive member; and
at least one solenoid coil arrangement, including at least one solenoid,
wherein the second conductive member forms a segment that has an approximate shape of an arc when viewed along a direction of extension of the first conductive member,
wherein the first and second conductive members form at least one magnetic field gradient coil structure,
wherein the at least one solenoid coil arrangement comprises:
at least one first solenoid coil,
at least one second solenoid coil, and
wherein the at least one first solenoid coil is wound in a first direction, and the at least one second solenoid coil is wound in a second direction which is opposite to the first direction.

16. The coil arrangement of claim 15, wherein the at least one first solenoid coil is electrically connected to a first power source, and the at least one second coil is electrically connected to a second power source which is different from the first power source.

17. The coil arrangement of claim 15, wherein the at least one first solenoid coil and the at least one second solenoid coil are configured to achieve at least one predetermined magnetic field transition.

18. A coil arrangement comprising,
a first conductive member;
a second conductive member electrically coupled to the first conductive member; and
at least one solenoid coil arrangement, including at least one solenoid,
wherein the second conductive member forms a segment that has an approximate shape of an arc when viewed along a direction of extension of the first conductive member,
wherein the first and second conductive members form at least one magnetic field gradient coil structure,
wherein the at least one magnetic field gradient coil structure generates at least one selectable non-uniform gradient field.

19. A coil arrangement comprising,
a first conductive member;
a second conductive member electrically coupled to the first conductive member; and
at least one solenoid coil arrangement, including at least one solenoid,
wherein the second conductive member forms a segment that has an approximate shape of an arc when viewed along a direction of extension of the first conductive member,
wherein the first and second conductive members form at least one magnetic field gradient coil structure,
wherein the at least one magnetic field gradient coil structure generates at least one long-axis gradient field.

20. A coil arrangement comprising,
a first conductive member;
a second conductive member electrically coupled to the first conductive member; and
at least one solenoid coil arrangement, including at least one solenoid,
wherein the second conductive member forms a segment that has an approximate shape of an arc when viewed alone a direction of extension of the first conductive member,
wherein the first and second conductive members form at least one magnetic field gradient coil structure,
wherein the at least one magnetic field gradient coil structure generates at least one transverse gradient field.

21. A coil arrangement comprising:
a first conductive member;
a second conductive member electrically coupled to the first conductive member;
a third conductive member which is directly electrically coupled to an input portion of each of the first and second conductive members; and
a fourth conductive member which is directly electrically coupled to an output portion of each of the first and second conductive members,
wherein at least one of the first conductive member or the second conductive member forms at least one arc which is approximately 360 degrees or less when viewed along a direction of extension of the first conductive member, and
wherein the first and second conductive members form at least one magnetic field gradient coil structure.

22. The coil arrangement of claim 21, wherein the at least one arc is approximately 270 degrees or less.

23. The coil arrangement of claim 21, wherein the at least one arc is approximately 180 degrees or less.

24. The coil arrangement of claim 21, wherein the at least one arc includes a plurality of arcs, and wherein at least a first one of the arcs is configured to allow a first current to flow in a first direction and at least a second one of the arcs is configured to allow a second current to flow in a second direction which is opposite to the first direction.

25. The coil arrangement of claim 21, wherein the at least one arc includes a plurality of arcs, and wherein at least a first one of the arcs is situated symmetrically opposite at least a second one of the arcs.

26. The coil arrangement of claim 25, wherein the first one of the arcs is configured to allow a first current to flow in a first direction and the second one of the arcs is adapted to allow a second current to flow in a second direction which is opposite to the first direction.

27. The coil arrangement of claim 21, wherein each of the first and second conductive members includes the at least one arc, and wherein each of the arcs is directly connected to the third and fourth conductive members.

28. A coil arrangement comprising:
a first conductive member arranged along a first axis;
a second conductive member arranged along a second axis which is approximately coaxial with the first axis; and
a plurality of switches configured to dynamically control an offset between the first and the second conductive members,
wherein the first conductive member is adapted to allow a first current to flow in a first direction, and the second conductive member is adapted to allow a second current to flow in a second direction which is opposite to the first direction, and
wherein the first and second conductive members form at least one magnetic field gradient coil structure.

29. The coil arrangement of claim 28, wherein at least a first switch of the plurality of switches allows the first current to flow through the first conductive member, and at least a second switch of the plurality of switches prevents the second current from flowing through the second conductive member.

30. The coil arrangement of claim 28, wherein the plurality of switches are configured to control the effective length of the coil arrangement or the distance between the first and second conductive members.

31. A coil arrangement comprising:
a first conductive member;
a second conductive member electrically coupled to the first conductive member;
a third conductive member, which is positioned approximately parallel to the first conductive member, and which is electrically coupled to the second conductive member;
a fourth conductive member electrically coupled to the first conductive member and the third conductive member; and
a plurality of switches configured to dynamically control an offset between the second and the fourth conductive members,
wherein the second conductive member forms a segment that has an approximate shape of an arc when viewed along a direction of extension of the first conductive member, and
wherein the first and second conductive members form at least one magnetic field gradient coil structure.

32. The coil arrangement of claim 31, wherein a first switch of the plurality of switches allows current to flow through the second conductive member, and a second switch of the plurality of switches prevents current from flowing through the fourth conductive member.

33. The coil arrangement of claim 31, wherein the plurality of switches are configured to control at least one of a modifiable length of the coil arrangement or a distance between the second and fourth conductive members.

34. A magnetic resonance system comprising a coil arrangement comprising:
a first conductive member;
a second conductive member electrically coupled to the first conductive member;
a third conductive member, which is positioned approximately parallel to the first conductive member, and which is electrically coupled to the second conductive member;
a fourth conductive member electrically coupled to the first conductive member and the third conductive member; and
a plurality of switches configured to dynamically control an offset between the second and the fourth conductive members,
wherein the second conductive member forms a segment that has an approximate shape of an arc when viewed along a direction of extension of the first conductive member, and
wherein the first and second conductive members form at least one magnetic field gradient coil structure.

35. A magnetic resonance system comprising a coil arrangement comprising:
a first conductive member arranged along a first axis;
a second conductive member arranged along a second axis which is approximately coaxial with the first axis; and
a plurality of switches configured to dynamically control an offset between the first and the second conductive members,
wherein the first conductive member is adapted to allow a first current to flow in a first direction, and the second conductive member is adapted to allow a second current to flow in a second direction which is opposite to the first direction, and
wherein the first and second conductive members form at least one magnetic field gradient coil structure.

36. The magnetic resonance system of claim 35, wherein the coil arrangement further comprises:
at least one other switch configured to dynamically control the offset between the first and the second conductive members.

37. A computer-readable medium for operating a magnetic resonance imaging system comprising a coil arrangement comprising a first conductive member arranged along a first axis and a second conductive member arranged along a second axis which is approximately coaxial with the first axis, the computer-readable medium having a set of instructions operable to direct a processor to perform the steps of:
permitting a first current to flow in a first direction in the first conductive member;
permitting a second current to flow in a second direction in the second conductive member, the second direction being opposite to the first direction; and
facilitating a plurality of switches to dynamically control an offset between the first and the second conductive members,
wherein the first and second conductive members form at least one magnetic field gradient coil structure.

38. A computer-readable medium for operating a magnetic resonance imaging system comprising a coil arrangement comprising a first conductive member arranged along a first axis and a second conductive member arranged along a second axis which is approximately coaxial with the first axis, the computer-readable medium having a set of instructions operable to direct a processor to perform the steps of:
permitting a first current to flow in a first direction in the first conductive member;
permitting a second current to flow in a second direction in the second conductive member, the second direction being opposite to the first direction; and
facilitating a plurality of switches to dynamically control an offset between the first and the second conductive members,
wherein the plurality of switches is configured to control at least one of a modifiable length of the coil arrangement or a distance between the second and the fourth conductive members, and
wherein the first and second conductive members form at least one magnetic field gradient coil structure.

39. A coil arrangement comprising:
a first conductive member arranged along a first axis; and
a second conductive member arranged along a second axis which is approximately coaxial with the first axis,
wherein the first and second conductive members form at least one magnetic field gradient coil structure, and
wherein the first conductive member is offset axially from the second conductive member.

40. A magnetic resonance imaging system comprising a coil arrangement comprising:
a first conductive member arranged along a first axis; and
a second conductive member arranged along a second axis which is approximately coaxial with the first axis,
wherein the first and second conductive members form at least one magnetic field gradient coil structure, and
wherein the first conductive member is offset axially from the second conductive member.

41. A method of providing a coil arrangement comprising:
providing a first conductive member arranged along a first axis; and
providing a second conductive member arranged along a second axis which is approximately coaxial with the first axis;
wherein the first and second conductive members form at least one magnetic field gradient coil structure, and
wherein the first conductive member is offset axially from the second conductive member.

42. A computer-readable medium for operating a magnetic resonance imaging system comprising a coil arrangement comprising a first conductive member arranged along a first axis and a second conductive member arranged along a second axis which is approximately coaxial with the first axis, the computer-readable medium having a set of instructions operable to direct a processor to perform the steps of:
facilitating a first current to flow in the first conductive member; and
facilitating a second current to flow in the second conductive member,
wherein the first and second conductive members form at least one magnetic field gradient coil structure, and
wherein the first conductive member is offset axially from the second conductive member.

* * * * *